US012683572B2

(12) United States Patent
Ouchi

(10) Patent No.: US 12,683,572 B2
(45) Date of Patent: Jul. 14, 2026

(54) ACOUSTIC WAVE DEVICE

(71) Applicant: Murata Manufacturing Co., Ltd., Nagaokakyo (JP)

(72) Inventor: Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 285 days.

(21) Appl. No.: 18/204,979

(22) Filed: Jun. 2, 2023

(65) Prior Publication Data

US 2023/0327636 A1 Oct. 12, 2023

Related U.S. Application Data

(63) Continuation of application No. PCT/JP2021/045486, filed on Dec. 10, 2021.

(Continued)

(51) Int. Cl.
| *H03H 9/02* | (2006.01) |
| *H03H 9/13* | (2006.01) |
| *H03H 9/205* | (2006.01) |

(52) U.S. Cl.
CPC .... *H03H 9/02157* (2013.01); *H03H 9/02228* (2013.01); *H03H 9/132* (2013.01); *H03H 9/205* (2013.01)

(58) Field of Classification Search
CPC ........ H03H 9/132; H03H 9/131; H03H 9/133; H03H 9/568; H03H 9/70; H03H 9/14541;

(Continued)

(56) References Cited

U.S. PATENT DOCUMENTS

| 10,491,192 B1 * | 11/2019 | Plesski | ............... | H03H 9/02228 |
| 2009/0231061 A1 * | 9/2009 | Tanaka | ............... | H03H 9/02551 |
| | | | | 333/195 |

(Continued)

FOREIGN PATENT DOCUMENTS

| CN | 109842397 A | 6/2019 |
| JP | 2012257019 A | 12/2012 |

(Continued)

OTHER PUBLICATIONS

Mizutani_Analysis of Lamb Wave Propagation Characteristics (Year: 1986).*

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a support substrate, a piezoelectric layer, an energy confining layer, a first resonator, and a second resonator. The piezoelectric layer includes a first principal surface and includes lithium niobate or lithium tantalate. The energy confining layer is provided between the support substrate and the piezoelectric layer. Each of the first resonator and the second resonator includes at least one pair of a first electrode and a second electrode provided to the first principal surface of the piezoelectric layer. The first resonator is structured to generate a thickness-shear mode bulk wave, and the second resonator is structured to generate a wave other than a thickness-shear mode bulk wave.

22 Claims, 17 Drawing Sheets

Related U.S. Application Data

(60) Provisional application No. 63/124,112, filed on Dec. 11, 2020.

(58) Field of Classification Search
CPC . H03H 9/6436; H03H 9/6483; H03H 9/02157
USPC ......... 333/133, 186–188, 193–196; 310/311, 310/313, 320, 324, 346–349, 357–367
See application file for complete search history.

(56) References Cited

U.S. PATENT DOCUMENTS

| | | |
|---|---|---|
| 2013/0057360 A1 | 3/2013 | Meltaus et al. |
| 2014/0145556 A1 | 5/2014 | Kadota |
| 2015/0162520 A1* | 6/2015 | Gong ................. H03H 9/02559 310/366 |
| 2016/0182007 A1* | 6/2016 | Bhattacharjee .......... H03H 3/02 29/25.35 |
| 2017/0179928 A1* | 6/2017 | Raihn .................... H03H 9/542 |
| 2019/0165763 A1 | 5/2019 | Mimura |
| 2019/0273478 A1* | 9/2019 | Lin ........................ H03H 9/587 |
| 2020/0295730 A1 | 9/2020 | Nagatomo et al. |
| 2021/0126624 A1* | 4/2021 | Hiramatsu ............. H03H 9/145 |

FOREIGN PATENT DOCUMENTS

| | | |
|---|---|---|
| JP | 2013528996 A | 7/2013 |
| JP | 2019102883 A | 6/2019 |
| WO | 2013021948 A1 | 2/2013 |
| WO | 2016147687 A1 | 9/2016 |
| WO | 2019111664 A1 | 6/2019 |

OTHER PUBLICATIONS

S. Yandrapalli et al., Analysis of XBAR Resonance and Higher Order Spurious Modes, 2019 IEEE Ultrasonics Symp., Oct. 6-9, 2019, pp. 185-188. (Year: 2019).*

International Search Report in PCT/JP2021/045486, mailed Feb. 15, 2022, 2 pages.

Written Opinion in PCT/JP2021/045486, mailed Feb. 15, 2022, 5 pages.

Official Communication issued in corresponding Chinese Patent Application No. 202180082429.8, maled on May 20, 2026, 10 pages.

* cited by examiner

ACOUSTIC WAVE DEVICE

CROSS REFERENCE TO RELATED APPLICATIONS

This application claims the benefit of priority to Provisional Application No. 63/124,112 filed on Dec. 11, 2020 and is a Continuation Application of PCT Application No. PCT/JP2021/045486 filed on Dec. 10, 2021. The entire contents of each application are hereby incorporated herein by reference.

BACKGROUND OF THE INVENTION

1. Field of the Invention

The present disclosure relates to an acoustic wave device.

2. Description of the Related Art

Japanese Unexamined Patent Application Publication No. 2012-257019 discloses an acoustic wave device.

SUMMARY OF THE INVENTION

Frequency characteristics of an acoustic wave device utilizing a thickness-shear first mode as described in Japanese Unexamined Patent Application Publication No. 2012-257019 depend on a thickness of a piezoelectric layer. Therefore, when all resonators of a filter are configured by the acoustic wave device, adjusting frequency characteristics (fractional bandwidth) of the filter may become difficult.

Preferred embodiments of the present invention make adjustments of a fractional bandwidth easier.

An acoustic wave device according to one aspect of a preferred embodiment of the present invention includes a support substrate, a piezoelectric layer, an energy confining layer, a first resonator, and a second resonator. The piezoelectric layer includes a first principal surface and lithium niobate or lithium tantalate. The energy confining layer is provided between the support substrate and the piezoelectric layer. Each of the first resonator and the second resonator includes at least one pair of a first electrode and a second electrode provided to the first principal surface of the piezoelectric layer. The first resonator is structured to generate a thickness-shear mode bulk wave, and the second resonator is structured to generate a wave other than a thickness-shear mode bulk wave.

An acoustic wave device according to another aspect of a preferred embodiment of the present invention includes a support substrate, a piezoelectric layer, an energy confining layer, a first resonator, and a second resonator. The piezoelectric layer includes a first principal surface and includes lithium niobate or lithium tantalate. The energy confining layer is provided between the support substrate and the piezoelectric layer. Each of the first resonator and the second resonator includes at least one pair of a first electrode and a second electrode provided to the first principal surface of the piezoelectric layer. Assuming that a film thickness of the piezoelectric layer is d and a center-to-center spacing distance between the first electrode and the second electrode adjacent to each other is p, d/p of the first resonator is about 0.5 or smaller, and d/p of the second resonator is larger than about 0.5.

According to preferred embodiments of the present disclosure, adjustment of the fractional bandwidth can be easier.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENT

Hereinafter, preferred embodiments of the present disclosure are described in detail with reference to the drawings. Note that the present disclosure is not limited by the preferred embodiments. Note that the preferred embodiments described in the present disclosure are merely illustration, and in modifications and preferred embodiments after the second preferred embodiment where a partial replacement or combination of configurations are possible between different preferred embodiments, description common with the first preferred embodiment is omitted, and only different points are described. Particularly, similar operation and effects attributed to similar configurations are not mentioned in each preferred embodiment.

First Preferred Embodiment

Figure 1A:
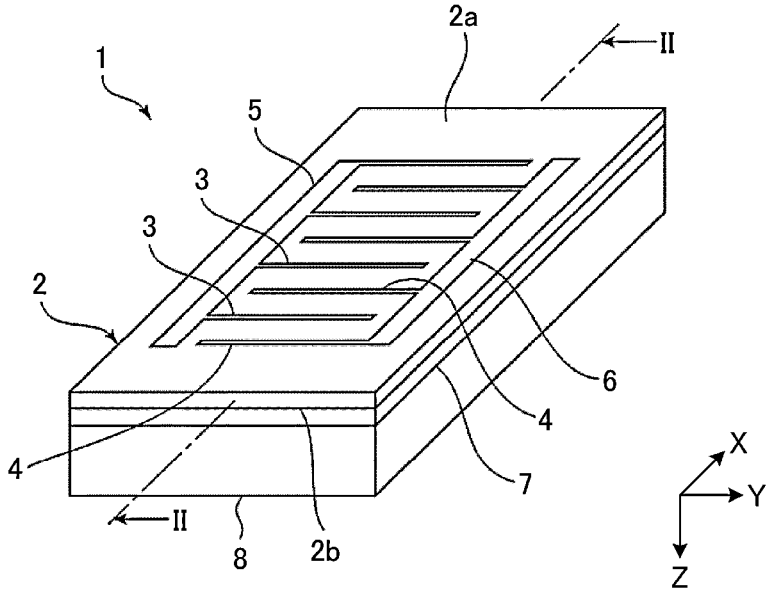
FIG. 1A is a perspective view illustrating an acoustic wave device of a first preferred embodiment of the present invention.
Figure 1B:
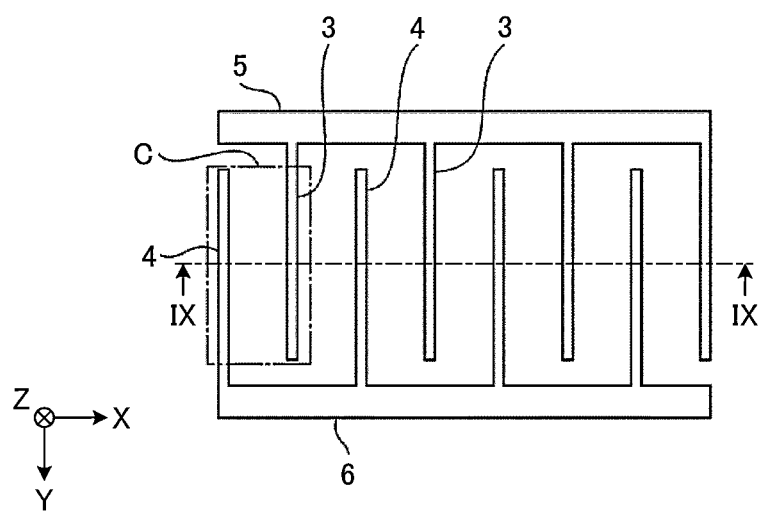
FIG. 1B is a plan view illustrating an electrode structure of the first preferred embodiment of the present invention.

FIG. 1A is a perspective view illustrating an acoustic wave device of a first preferred embodiment. FIG. 1B is a plan view illustrating an electrode structure of the first preferred embodiment.

An acoustic wave device 1 of a first preferred embodiment includes a piezoelectric layer 2 including LiNbO₃. The piezoelectric layer 2 may include LiTaO₃. Cut-angles of the LiNbO₃ or the LiTaO₃ are Z-cut in the first preferred embodiment. The cut-angles of the LiNbO₃ or the LiTaO₃ may be rotated Y-cut or X-cut. Preferably, propagation directions of a Y-propagation and an X-propagation±30° are preferable.

A thickness of the piezoelectric layer 2 is not particularly limited, but preferably about 50 nm or larger and about 1000 nm or smaller, for example, in order to effectively excite a thickness-shear first mode.

The piezoelectric layer 2 includes a first principal surface 2a and a second principal surface 2b opposed to each other in a Z direction. An electrode 3 and an electrode 4 are provided on the first principal surface 2a.

Here, the electrode 3 is one example of a "first electrode", and the electrode 4 is one example of a "second electrode". In FIGS. 1A and 1B, a plurality of electrodes 3 are connected to a first busbar electrode 5. A plurality of electrodes 4 are connected to a second busbar electrode 6. The plurality of electrodes 3 and the plurality of electrodes 4 interdigitate with each other. Therefore, an IDT electrode (a first IDT electrode 30 which will be described later) including the electrode 3, the electrode 4, the first busbar electrode 5, and the second busbar electrode 6 is provided.

Each of the electrode 3 and the electrode 4 has a rectangular or substantially rectangular shape and a longitudinal direction. The electrode 3 and the electrode 4 adjacent to the electrode 3 are opposed to each other in a direction orthogonal or substantially orthogonal to the longitudinal direction. The longitudinal direction of the electrode 3 and the electrode 4 and the direction orthogonal or substantially orthogonal to the longitudinal direction of the electrode 3 and the electrode 4 are both directions intersecting with a thickness direction of the piezoelectric layer 2. Therefore, the electrode 3 and the electrode 4 adjacent to the electrode 3 can be said to be opposed to each other in a direction intersecting with the thickness direction of the piezoelectric layer 2. Description may be given below while the thickness direction of the piezoelectric layer 2 is referred to as the Z direction (or a first direction), the longitudinal direction of the electrode 3 and the electrode 4 is referred to as a Y direction (or a second direction), and the direction orthogonal or substantially orthogonal to the longitudinal direction of the electrode 3 and the electrode 4 is referred to as an X direction (or a third direction).

Moreover, the longitudinal direction of the electrode 3 and the electrode 4 may be interchanged with the direction orthogonal or substantially orthogonal to the longitudinal direction of the electrode 3 and the electrode 4 illustrated in FIGS. 1A and 1B. That is, in FIGS. 1A and 1B, the electrode 3 and the electrode 4 may be extended in a direction in which the first busbar electrode 5 and the second busbar electrode 6 are extended. In this case, the first busbar electrode 5 and the second busbar electrode 6 are extended in the direction in which the electrode 3 and the electrode 4 are extended in FIGS. 1A and 1B. Further, a plurality of pairs of the electrode 3 and the electrode 4, the electrode 3 and the electrode 4 being adjacent to each other, are arranged in the direction orthogonal or substantially orthogonal to the longitudinal direction of the electrode 3 and the electrode 4. The electrode 3 is connected to one potential and the electrode 4 is connected to the other potential.

Here, "the electrode 3 and the electrode 4 being adjacent to each other" does not indicate a case where the electrode 3 and the electrode 4 are arranged to be in direct contact with each other, but indicates a case where the electrode 3 and the electrode 4 are positioned to have a space therebetween. Moreover, when the electrode 3 and the electrode 4 are adjacent to each other, electrodes connected to a hot electrode or a ground electrode (including another electrode 3 and electrode 4) are not disposed between the electrode 3 and the electrode 4. The number of pairs does not have to be an integer number, but may be 1.5 pairs, 2.5 pairs, or the like.

A center-to-center spacing distance between the electrode 3 and the electrode 4 (that is, a pitch) is preferably about 1 μm or larger and about 10 μm or smaller, for example. Moreover, the center-to-center spacing distance between the electrode 3 and the electrode 4 is a distance connecting the center in a width of the electrode 3 in the direction orthogonal or substantially orthogonal to the longitudinal direction of the electrode 3 to the center in a width of the electrode 4 in the direction orthogonal or substantially orthogonal to the longitudinal direction of the electrode 4.

Moreover, when at least one of the electrode 3 and the electrode 4 includes a plurality of electrodes 3 and/or electrodes 4 (1.5 or more electrode pairs are provided when the electrode 3 and the electrode 4 are assumed as one electrode pair), the center-to-center spacing distance between the electrode 3 and the electrode 4 is an average value of the center-to-center spacing distances of the respective 1.5 or more pairs of the electrode 3 and the electrode 4 adjacent to each other.

Moreover, the width of each of the electrode 3 and the electrode 4 (that is, a dimension of each of the electrode 3 and the electrode 4 in the opposing direction thereof) is preferably about 150 nm or larger and about 1000 nm or smaller, for example. Note that the center-to-center spacing distance between the electrode 3 and the electrode 4 is a distance connecting the center in the dimension (width) of the electrode 3 in the direction orthogonal or substantially orthogonal to the longitudinal direction of the electrode 3 to the center in the dimension (width) of the electrode 4 in the direction orthogonal or substantially orthogonal to the longitudinal direction of the electrode 4.

Moreover, in the first preferred embodiment, the Z-cut piezoelectric layer is included. Therefore, the direction orthogonal or substantially orthogonal to the longitudinal direction of the electrode 3 and the electrode 4 is a direction orthogonal or substantially orthogonal to a polarization direction of the piezoelectric layer 2. This is not applicable when a piezoelectric material having other cut-angles is used as the piezoelectric layer 2. Here, "being orthogonal" is not limited to a case of strictly being orthogonal, but includes being substantially orthogonal (an angle between the direction orthogonal or substantially orthogonal to the longitudinal direction of the electrode 3 and the electrode 4 and the polarization direction is about 90°±10°, for example).

Figure 2:
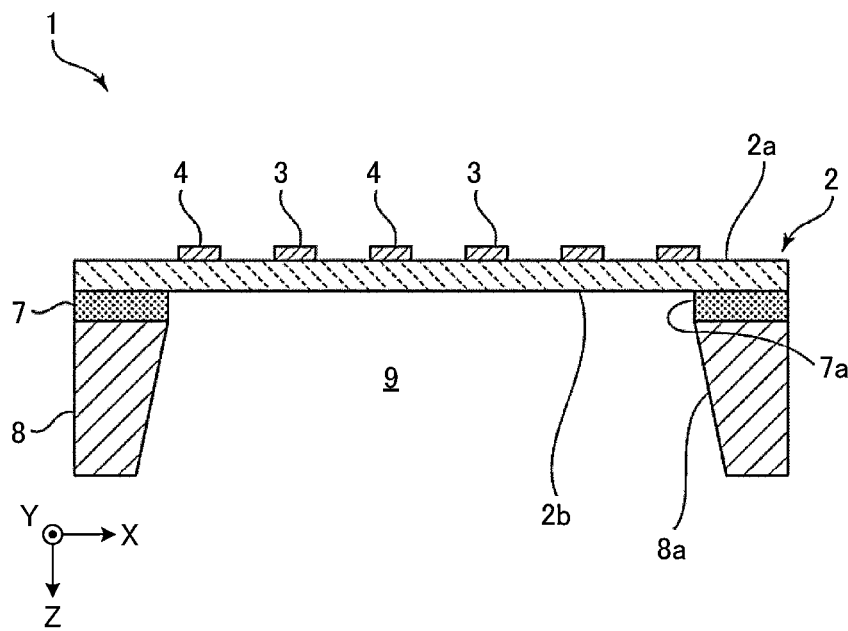
FIG. 2 is a partial sectional view taken along a line II-II in FIG. 1A.

A support substrate 8 is laminated on the second principal surface 2b side of the piezoelectric layer 2 with a dielectric film 7 interposed therebetween. The dielectric film 7 and the support substrate 8 have a frame-like shape, and have cavities 7a and 8a as illustrated in FIG. 2, respectively. Thus, a hollow portion (air gap) 9 is formed.

The hollow portion 9 does not interrupt or interfere with vibration of an excitation range C of the piezoelectric layer 2. Therefore, the support substrate 8 is laminated to the second principal surface 2b with the dielectric film 7 interposed therebetween at a position not overlapping the portion where at least one pair of the electrode 3 and the electrode 4 is provided. Note that the dielectric film 7 does not have to be provided. Thus, the support substrate 8 may directly or indirectly be laminated to the second principal surface 2b of the piezoelectric layer 2.

The dielectric film 7 is formed by silicon oxide. Note that the dielectric film 7 can be formed by suitable insulating material such as silicon nitride and alumina, other than silicon oxide.

The support substrate 8 is formed by Si. A plane direction of a surface of the Si on the piezoelectric layer 2 side may be (100) or (110), or may be (111). The Si is preferably highly resistive Si having resistivity of about 4 kΩ or higher, for example. Note that also the support substrate 8 may be include suitable insulating material or semiconductor material. As material of the support substrate 8, for example, piezoelectric material (for example, aluminum oxide, lithium tantalate, lithium niobate, and crystal), various ceramics (for example, alumina, magnesia, sapphire, silicon nitride, aluminum nitride, silicon carbide, zirconia, cordierite, mullite, steatite, and forsterite), a dielectric (for example, diamond and glass), a semiconductor (for example, gallium nitride), or the like can be used.

The plurality of electrodes 3 and electrodes 4, the first busbar electrode 5, and the second busbar electrode 6 are made of suitable metal or alloy (for example, Al and AlCu alloy). In the first preferred embodiment, each of the electrode 3, the electrode 4, the first busbar electrode 5, and the second busbar electrode 6 has a structure where an Al film is laminated on a Ti film. Note that an adhesion layer other than the Ti film may be used.

For activation, AC voltage is applied between the plurality of electrodes 3 and the plurality of electrodes 4. More specifically, AC voltage is applied between the first busbar electrode 5 and the second busbar electrode 6. Therefore, resonance characteristics utilizing a thickness-shear first mode bulk wave excited in the piezoelectric layer 2 can be obtained.

Moreover, in the acoustic wave device 1, assuming that a thickness of the piezoelectric layer 2 is d and the center-to-center spacing distance between one pair of the electrode 3 and the electrode 4 adjacent to each other among the plurality of pairs of the electrode 3 and the electrode 4 is p, d/p is about 0.5 or smaller, for example. Therefore, the thickness-shear first mode bulk wave is effectively excited, and favorable resonance characteristics can be obtained. The d/p is more preferably about 0.24 or smaller, for example, and in this case, further favorable resonance characteristics can be obtained.

Note that when at least one of the electrode 3 and the electrode 4 includes a plurality of electrodes 3 and/or electrodes 4 like the first preferred embodiment, (that is, 1.5 or more electrode pairs are provided when the electrode 3 and the electrode 4 are assumed as one electrode pair), the center-to-center spacing distance p between the electrode 3 and the electrode 4 adjacent to each other is an average distance of the center-to-center spacing distances of the respective pairs of the electrode 3 and the electrode 4 adjacent to each other.

Since the acoustic wave device 1 of the first preferred embodiment has the configuration described above, even when the number of pairs of the electrode 3 and the electrode 4 is reduced for size reduction, a Q factor is less likely to decrease. This is because a resonator does not require reflectors on both sides and propagation loss is small. Moreover, the reflector is unnecessary because of utilization of the thickness-shear first mode bulk wave.

Figure 3A:
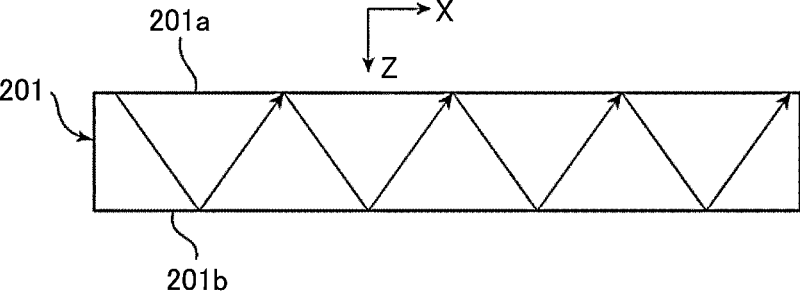
FIG. 3A is a schematic sectional view illustrating a Lamb wave propagating in a piezoelectric layer of a comparative example.
Figure 3B:
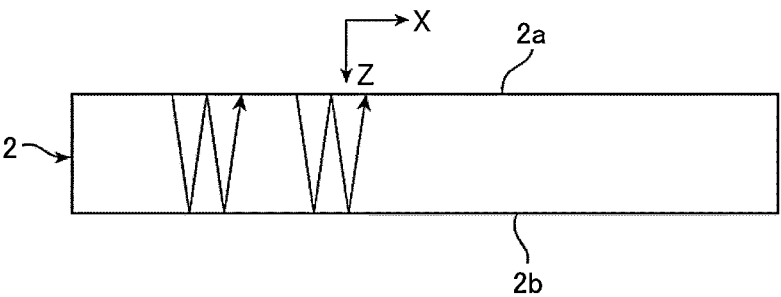
FIG. 3B is a schematic sectional view illustrating a thickness-shear first mode bulk wave propagating in a piezoelectric layer of the first preferred embodiment of the present invention.
Figure 4:
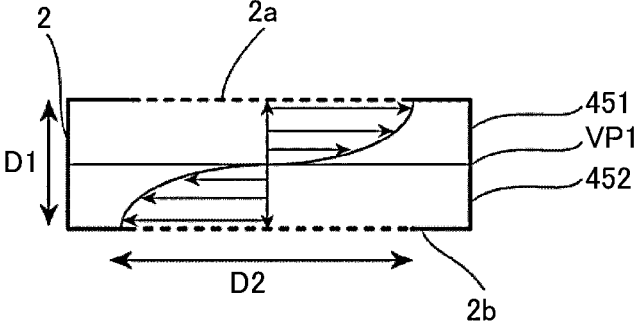
FIG. 4 is a schematic sectional view illustrating an amplitude direction of the thickness-shear first mode bulk wave propagating in the piezoelectric layer of the first preferred embodiment of the present invention.

FIG. 3A is a schematic sectional view illustrating a Lamb wave propagating in a piezoelectric layer of a comparative example. FIG. 3B is a schematic sectional view illustrating a thickness-shear first mode bulk wave propagating in a piezoelectric layer of the first preferred embodiment. FIG. 4 is a schematic sectional view illustrating an amplitude direction of the thickness-shear first mode bulk wave propagating in the piezoelectric layer of the first preferred embodiment.

FIG. 3A illustrates the acoustic wave device as described in Japanese Unexamined Patent Application Publication No. 2012-257019, and a Lamb wave propagates in a piezoelectric layer. As illustrated in FIG. 3A, the wave propagates in a piezoelectric layer 201 as indicated by an arrow. Here, the piezoelectric layer 201 includes a first principal surface 201a and a second principal surface 201b, and a thickness direction connecting the first principal surface 201a to the second principal surface 201b is the Z direction. The X direction is a direction in which the electrodes 3 and 4 of the IDT electrode are aligned. As illustrated in FIG. 3A, the Lamb wave propagates in the X direction as illustrated in the drawing. It is a plate wave, and thus, the wave propagates in the X direction although the piezoelectric layer 201 vibrates as a whole. Therefore, resonance characteristics are obtained by reflectors being disposed on both sides. As a result, propagation loss of the wave occurs, and a Q factor decreases when attempting the size reduction (that is, when the number of pairs of the electrodes 3 and 4 is reduced).

On the other hand, in the acoustic wave device of the first preferred embodiment, as illustrated in FIG. 3B, vibration displacement is a thickness shear direction. Therefore, the wave propagates substantially in the direction connecting the first principal surface 2a to the second principal surface 2b of the piezoelectric layer 2 (that is, in the Z direction) and resonates. That is, an X-direction component of the wave is extremely smaller than a Z-direction component of the wave. Then, since the resonance characteristics are obtained by the wave propagation in the Z direction, reflectors are unnecessary. Thus, propagation loss caused during propagation to the reflectors does not occur. Therefore, even when the number of electrode pairs of the electrode 3 and the electrode 4 is reduced for size reduction, the Q factor is less likely to decrease.

Note that, as illustrated in FIG. 4, amplitude directions of the thickness-shear first mode bulk wave are opposite in a first range 451 included in the excitation range C (see FIG. 1B) of the piezoelectric layer 2 and a second range 452 included in the excitation range C. FIG. 4 schematically illustrates a bulk wave in a case where a voltage having a higher potential at the electrode 4 than the electrode 3 is applied between the electrode 3 and the electrode 4. The first range 451 is a range in the excitation range C, located between an imaginary plane VP1 orthogonal to the thickness direction of the piezoelectric layer 2 and dividing the piezoelectric layer 2 into two and the first principal surface 2a. The second range 452 is a range in the excitation range C, located between the imaginary plane VP1 and the second principal surface 2b.

In the acoustic wave device 1, although at least one pair of electrodes including the electrode 3 and the electrode 4 is provided, this configuration is not for propagating the wave in the X direction. Therefore, it is not always necessary that the pair of the electrode 3 and the electrode 4 includes a plurality of pairs of the electrode 3 and the electrode 4. That is, the number of pairs may be any number as long as at least one pair of electrodes is provided.

For example, the electrode 3 is an electrode connected to a hot potential, and the electrode 4 is an electrode connected to a ground potential. Note that the electrode 3 may be connected to the ground potential, and the electrode 4 may be connected to the hot potential. In the first preferred embodiment, each electrode in the at least one pair of electrodes is an electrode connected to the hot potential or an electrode connected to the ground potential as described above, and a floating electrode is not provided.

Figure 5:
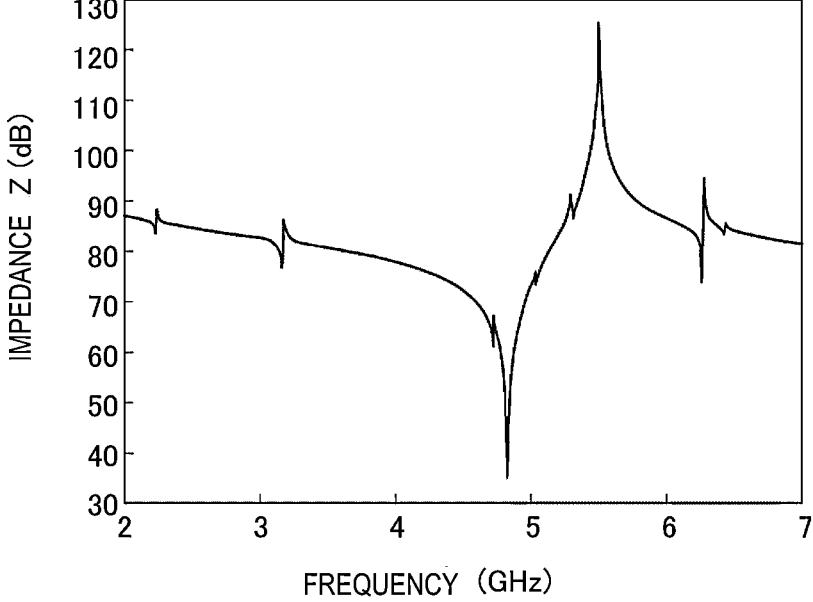
FIG. 5 is an explanatory diagram illustrating an example of resonance characteristics of the acoustic wave device of the first preferred embodiment of the present invention.

FIG. 5 is an explanatory diagram illustrating an example of resonance characteristics of the acoustic wave device of the first preferred embodiment. Note that design parameters of the acoustic wave device 1 which obtains the resonance characteristics illustrated in FIG. 5 are as follows.

Piezoelectric layer 2: LiNbO$_3$ having Euler angles (0°, 0°, 90°)
Thickness of piezoelectric layer 2: about 400 nm
Length of excitation range C (see FIG. 1B): about 40 μm
Number of electrode pairs of electrode 3 and electrode 4: 21 pairs
Center-to-center spacing distance (pitch) between electrode 3 and electrode 4: about 3 μm
Width of electrode 3 and electrode 4: about 500 nm
d/p: about 0.133
Dielectric film 7: silicon oxide film having thickness of about 1 μm
Support substrate 8: Si
Note that the excitation range C (see FIG. 1B) is an overlapping range of the electrode 3 and the electrode 4 when seen in the X direction orthogonal or substantially orthogonal to the longitudinal direction of the electrode 3 and the electrode 4. The length of the excitation range C is a dimension of the excitation range C in the longitudinal direction of the electrode 3 and the electrode 4.

In the first preferred embodiment, a distance between electrodes in each electrode pair of the electrode 3 and the electrode 4 is equal in all of the plurality of electrode pairs. That is, the electrode 3 and the electrode 4 are positioned with an equal pitch.

As is apparent in FIG. 5, favorable resonance characteristics having a fractional bandwidth of about 12.5% is obtained regardless of not having a reflector.

Meanwhile, assuming that the thickness of the piezoelectric layer 2 is d and the center-to-center spacing distance between the electrode 3 and the electrode 4 is p, in the first preferred embodiment, d/p is about 0.5 or smaller, and more preferably, about 0.24 or smaller, for example. This is described with reference to FIG. 6.

Figure 6:
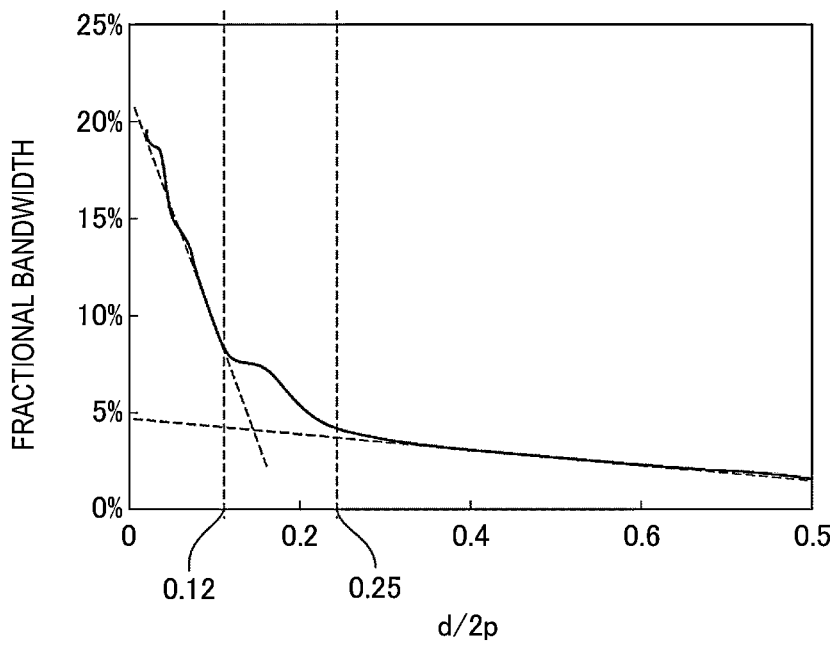
FIG. 6 is an explanatory diagram illustrating relation between d/2p and a fractional bandwidth as a resonator in the acoustic wave device of the first preferred embodiment of the present invention, where a center-to-center spacing distance or an average distance of the center-to-center spacing distances between electrodes adjacent to each other is p and an average thickness of the piezoelectric layer is d.

Similarly to the acoustic wave device which obtains the resonance characteristics illustrated in FIG. 5, a plurality of acoustic wave devices are obtained while changing d/2p. FIG. 6 is an explanatory diagram illustrating relation between d/2p and a fractional bandwidth as a resonator in the acoustic wave device of the first preferred embodiment, where a center-to-center spacing distance or an average distance of the center-to-center spacing distances between electrodes adjacent to each other is p and an average thickness of the piezoelectric layer 2 is d.

As illustrated in FIG. 6, when d/2p exceeds about 0.25 (that is, d/p>about 0.5), the fractional bandwidth is smaller than about 5% regardless of adjustment of d/p. On the other hand, in a case of d/2p≤about 0.25 (that is, d/p≤about 0.5), the fractional bandwidth can be brought to about 5% or higher when d/p is changed within the range, for example. That is, a resonator having a high coupling coefficient can be configured. Moreover, when d/2p is about 0.12 or smaller (that is, d/p is about 0.24 or smaller), the fractional bandwidth can be increased to about 7% or higher, for example. In addition to this, by d/p being adjusted within the range, a resonator with a further wider fractional bandwidth can be obtained, and a resonator having a further higher coupling coefficient can be realized. Therefore, like the second invention of this application, by d/p being about 0.5 or smaller, a resonator having a high coupling coefficient utilizing thickness-shear first mode bulk wave can be configured.

Note that the at least one pair of electrodes may be one pair, and in this case, the p is the center-to-center spacing distance between the electrode 3 and the electrode 4 adjacent to each other. Moreover, in a case of 1.5 or more pairs of electrodes being provided, an average distance of the center-to-center spacing distances between the electrode 3 and the electrode 4 adjacent to each other may be considered as the p.

Moreover, also in terms of the thickness d of the piezoelectric layer 2, when the piezoelectric layer 2 has variations in thickness, a value of an averaged thickness may be adopted.

Figure 7:
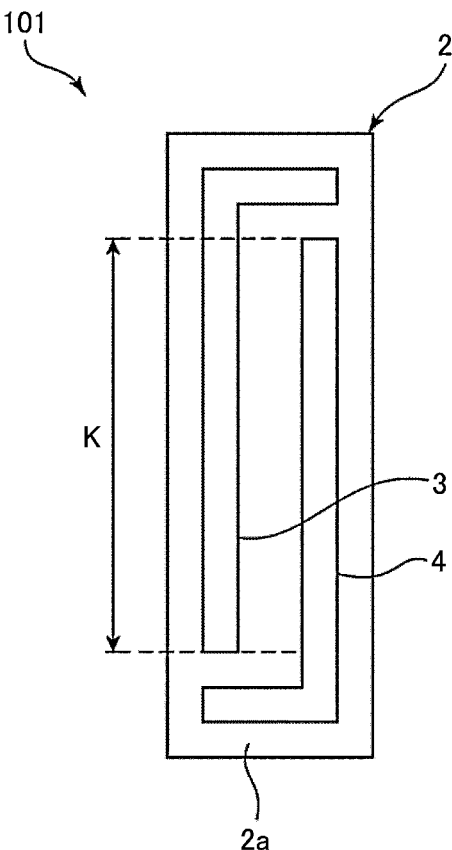
FIG. 7 is a plan view illustrating an example where one pair of electrodes are provided in the acoustic wave device of the first preferred embodiment of the present invention.

FIG. 7 is a plan view illustrating an example where one pair of electrodes are provided in the acoustic wave device of the first preferred embodiment. In an acoustic wave device 101, one pair of electrodes including the electrode 3 and the electrode 4 are provided on the first principal surface 2a of the piezoelectric layer 2. Note that K in FIG. 7 is an intersecting width. As described above, in the acoustic wave device of the present disclosure, the number of pairs of electrodes may be one. Also in this case, a thickness-shear first mode bulk wave can effectively be excited when d/p is about 0.5 or smaller, for example.

In the acoustic wave device 1, preferably, a metallization ratio MR of the electrode 3 and the electrode 4 adjacent to each other among the plurality of electrodes 3 and electrodes 4 with respect to the excitation range C which is a range where the adjacent electrodes 3 and 4 overlap each other in the opposing direction desirably satisfies MR≤about 1.75(d/p)+0.075. In this case, a spurious can effectively be reduced. This is described with reference to FIGS. 8 and 9.

Figure 8:
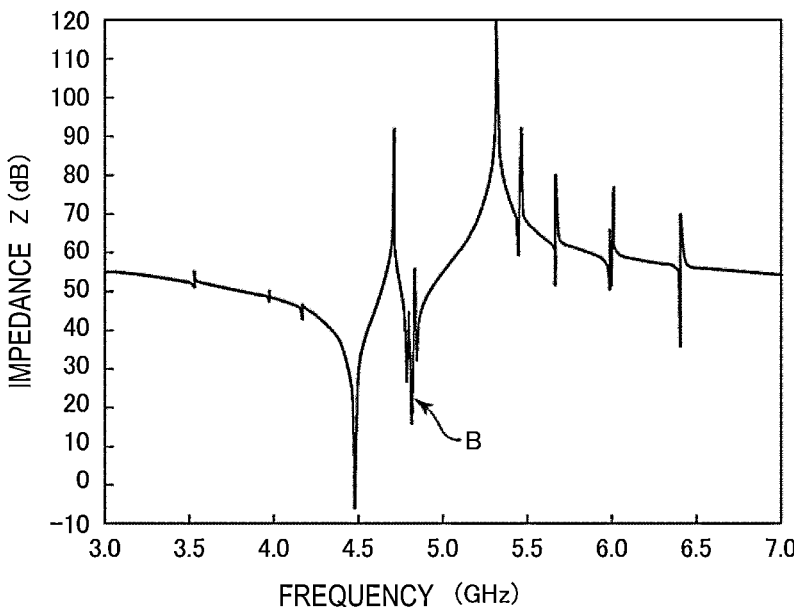
FIG. 8 is a reference diagram illustrating one example of resonance characteristics of the acoustic wave device of the first preferred embodiment of the present invention.

FIG. 8 is a reference diagram illustrating one example of resonance characteristics of the acoustic wave device of the first preferred embodiment. A spurious indicated by an arrow B appears between a resonant frequency and an anti-resonant frequency. Note that it is assumed that d/p=about 0.08 and the Euler angles of the LiNbO₃ are (0°, 0°, 90°), for example. Moreover, the metallization ratio MR=about 0.35 is satisfied.

The metallization ratio MR is described with reference to FIG. 1B. In the electrode structure illustrated in FIG. 1B, assume that only one pair of the electrode 3 and the electrode 4 is provided when focusing on the one pair of the electrode 3 and the electrode 4. In this case, a portion surrounded by a one-dot chain line is the excitation range C. The excitation range C is, when the electrode 3 and the electrode 4 are seen in the direction orthogonal or substantially orthogonal to the longitudinal direction of the electrode 3 and the electrode 4 (that is, in the opposing direction thereof), a range of the electrode 3 overlapping the electrode 4, a range of the electrode 4 overlapping the electrode 3, and a range between the electrode 3 and the electrode 4 where the electrode 3 and the electrode 4 overlap each other. An area of the electrode 3 and the electrode 4 within the excitation range C with respect to an area of the excitation range C is the metallization ratio MR. That is, the metallization ratio MR is a ratio of the area of the metallization portion to the area of the excitation range C.

Note that when a plurality of pairs of the electrode 3 and the electrode 4 are provided, a ratio of a metallization portion included in the entire excitation range C with respect to the total area of the excitation range C may be considered as the MR.

Figure 9:
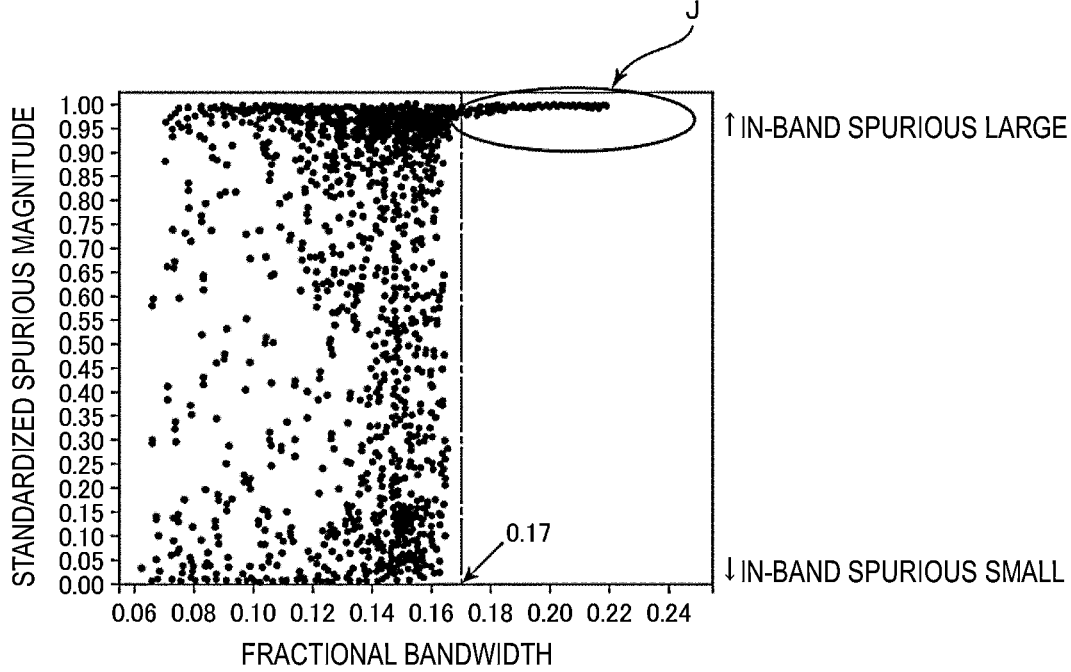
FIG. 9 is an explanatory diagram illustrating relation of a fractional bandwidth and an amount of phase rotation of impedance of a spurious standardized at 180 degrees as spurious magnitude when a plurality of acoustic wave resonators are configured in the acoustic wave device of the first preferred embodiment of the present invention.

FIG. 9 is an explanatory diagram illustrating relation of a fractional bandwidth and an amount of phase rotation of impedance of a spurious standardized at 180 degrees as spurious magnitude when a plurality of acoustic wave resonators are configured in the acoustic wave device of the first preferred embodiment. Note that the fractional bandwidth is adjusted while the film thickness of the piezoelectric layer 2 and the dimensions of the electrode 3 and the electrode 4 are variously changed. Moreover, although FIG. 9 illustrates results when a Z-cut LiNbO₃ piezoelectric layer 2 is used, similar tendency can be obtained when the piezoelectric layer 2 having other cut-angles is used.

In a range surrounded by an oval J in FIG. 9, a spurious is large at about 1.0, for example. As is apparent in FIG. 9, when the fractional bandwidth exceeds about 0.17 (that is, exceeds about 17%), for example, a large spurious at 1 or larger spurious level appears in a pass band even when the parameter that constitutes the fractional bandwidth is changed. That is, like the resonance characteristics illustrated in FIG. 8, the large spurious indicated by the arrow B appears in the band. Therefore, the fractional bandwidth is preferably about 17% or lower, for example. In this case, the spurious can be made smaller by adjusting the film thickness of the piezoelectric layer 2, the dimensions of the electrode 3 and the electrode 4, and other factors.

Figure 10:
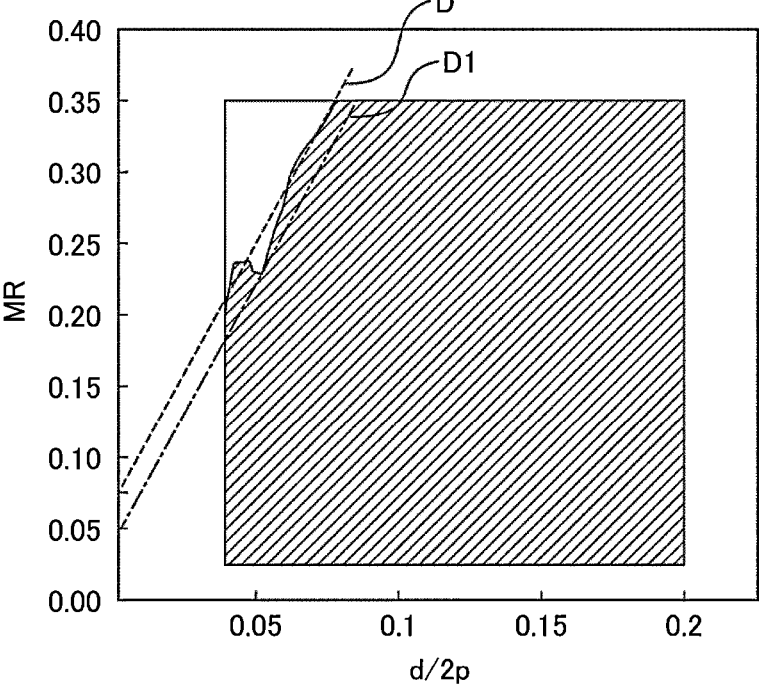
FIG. 10 is an explanatory diagram illustrating relation between d/2p, a metallization ratio MR, and the fractional bandwidth.

FIG. 10 is an explanatory diagram illustrating relation between d/2p, the metallization ratio MR, and the fractional bandwidth. In the acoustic wave device 1 of the first preferred embodiment, various acoustic wave devices 1 with different d/2p and MR are configured, and the fractional bandwidths thereof are measured. A hatched portion on the right side of a broken line D in FIG. 10 is a range where the fractional bandwidth is about 17% or lower, for example. A boundary between the hatched range and a range without hatching is represented by MR=about 3.5(d/2p)+0.075, for example. That is, MR=about 1.75(d/p)+0.075 is satisfied, and thus, preferably, MR≤about 1.75(d/p)+0.075 is satisfied, for example. In this case, the fractional bandwidth can easily be brought to about 17% or lower, for example. A range on the right side of a one-dot chain line D1 (MR=about 3.5(d/2p)+0.05), for example, in FIG. 10 is more preferable. That is, the fractional bandwidth can certainly be about 17% or lower in a case of MR≤about 1.75(d/p)+0.05, for example.

Figure 11:
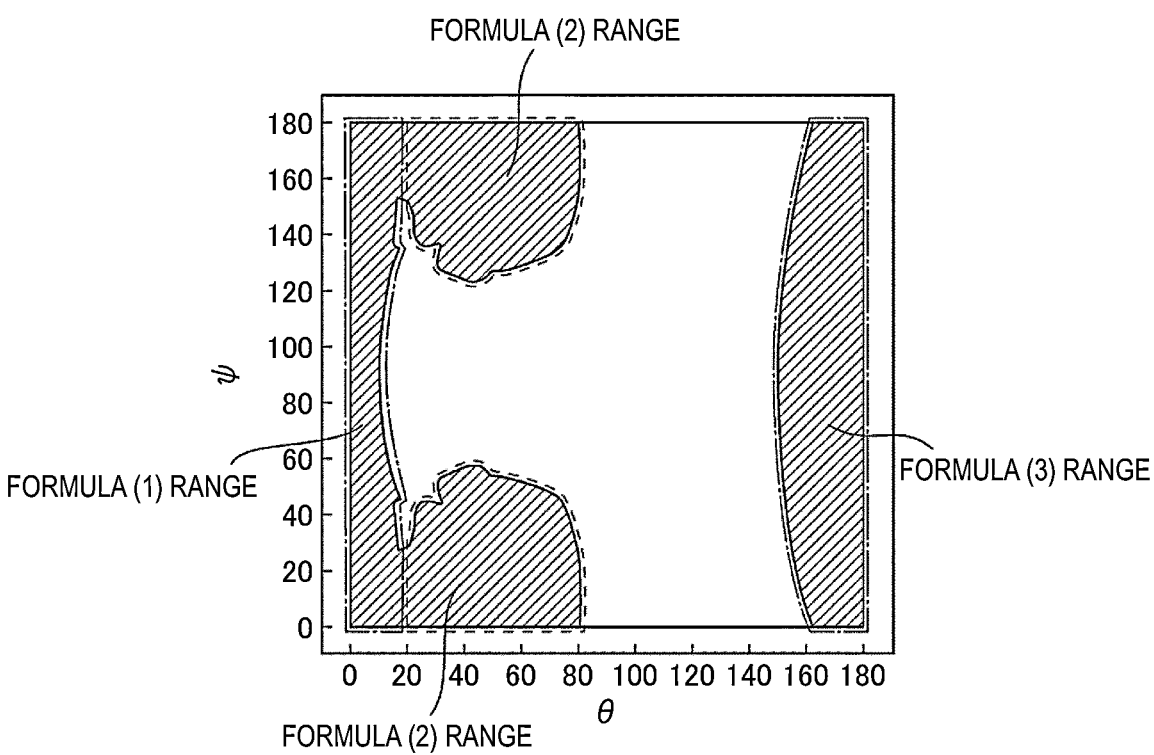
FIG. 11 is an explanatory diagram illustrating a map of the fractional bandwidth with respect to Euler angles $(0°, \theta, \psi)$ of $LiNbO_3$ when d/p is brought infinitely closer to zero.

FIG. 11 is an explanatory diagram illustrating a map of the fractional bandwidth with respect to Euler angles (0°, θ, ψ) of LiNbO₃ when d/p is brought infinitely closer to zero. A hatched portion in FIG. 11 is a range where a fractional bandwidth of at least about 5% or higher can be obtained. A range expressed by the following Formulas (1), (2), and (3) is obtained when the ranges are approximated.

$$(0°\pm10°, 0° \text{ to } 20°, \text{any } \psi) \tag{1}$$

$$(0°\pm10°, 20° \text{ to } 80°, 0° \text{ to } 60° (1-(\theta-50)^2/900)^{1/2}) \text{ or } \\ (0°\pm10°, 20° \text{ to } 80°, [180°-60° (1-(\theta-50)^2/ \\ 900)^{1/2}] \text{ to } 180°) \tag{2}$$

$$(0°\pm10°, [180°-30° (1-(\psi-90)^2/8100)^{1/2}] \text{ to } 180°, \\ \text{any } \psi) \tag{3}$$

Therefore, in the case of the Euler angle range in the Formula (1), (2), or (3), the fractional bandwidth can sufficiently be widened, which is preferable.

Figure 12:
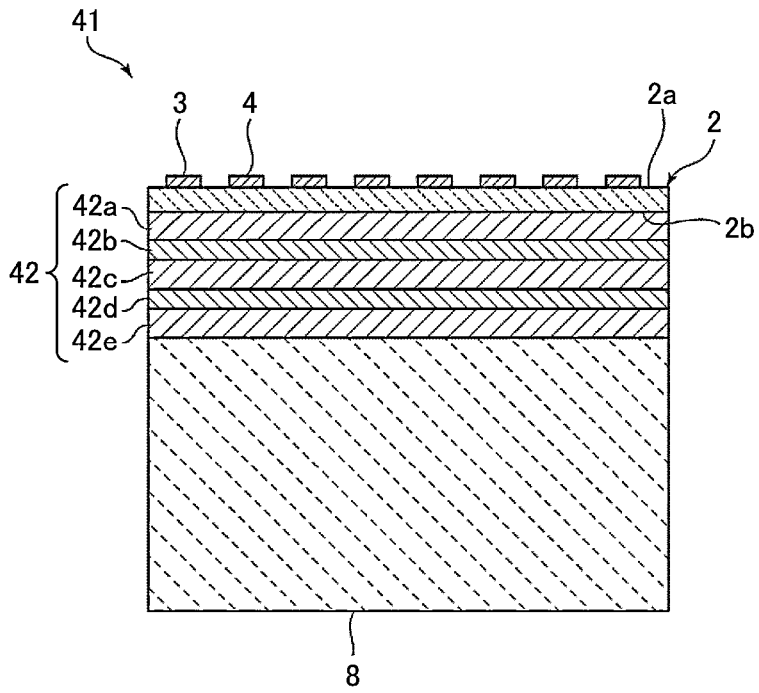
FIG. 12 is a modification of the first preferred embodiment of the present invention and is a partial sectional view taken along the line II-II in FIG. 1A.

FIG. 12 is a modification of the first preferred embodiment and is a partial sectional view taken along the line II-II in FIG. 1A. In an acoustic wave device 41, an acoustic multilayer film 42 is laminated to the second principal surface 2b of the piezoelectric layer 2. The acoustic multilayer film 42 has a multilayer structure including low acoustic impedance layers 42a, 42c, and 42e having a relatively low acoustic impedance and high acoustic impedance layers 42b and 42d having a relatively high acoustic impedance. When the acoustic multilayer film 42 is used, a thickness-shear first mode bulk wave can be confined in the piezoelectric layer 2 without use of the hollow portion 9 of the acoustic wave device 1. Also in the acoustic wave device 41, by d/p being about 0.5 or smaller, for example, the resonance characteristics based on the thickness-shear first mode bulk wave can be obtained. Note that, in the acoustic multilayer film 42, the number of laminated layers of the low acoustic impedance layers 42a, 42c, and 42e and the high acoustic impedance layers 42b and 42d is not particularly limited, as long as at least one high acoustic impedance layer 42b, 42d is disposed farther than the low acoustic impedance layer 42a, 42c, 42e, from the piezoelectric layer 2.

The low acoustic impedance layers 42a, 42c, and 42e and the high acoustic impedance layers 42b and 42d can be configured by suitable material, as long as it satisfies the acoustic impedance relation described above. For example, as the material of the low acoustic impedance layers 42a, 42c, and 42e, silicon oxide, silicon oxynitride, or the like may be used. Moreover, as the material of the high acoustic impedance layers 42*b* and 42*d*, alumina, silicon nitride, metal such as platinum, or the like may be used.

Figure 13:
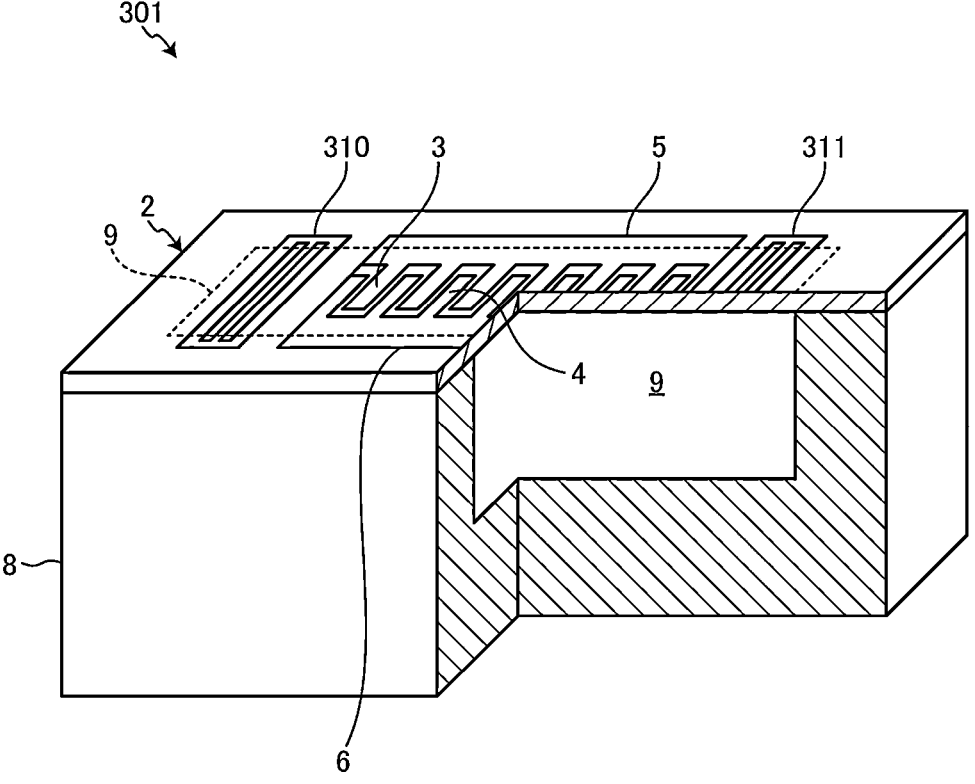
FIG. 13 is a partially cutaway perspective view illustrating the acoustic wave device according to the preferred embodiment of the present invention.

FIG. 13 is a partially cutaway perspective view illustrating the acoustic wave device according to the present preferred embodiment of the present disclosure. In FIG. 13, a peripheral edge of the hollow portion 9 is indicated by a broken line. The acoustic wave device of the present disclosure may utilize a plate wave. In this case, an acoustic wave device 301 includes reflectors 310 and 311 as illustrated in FIG. 13. The reflectors 310 and 311 are provided to both sides of the electrodes 3 and 4 of the piezoelectric layer 2 in the acoustic wave propagation direction. In the acoustic wave device 301, by an AC electric field being applied to the electrodes 3 and 4 above the hollow portion 9, a Lamb wave as a plate wave is excited. At this time, since the reflectors 310 and 311 are provided on both sides, resonance characteristics by the Lamb wave as the plate wave can be obtained.

As described above, in the acoustic wave devices 1 and 101, a thickness-shear first mode bulk wave is utilized. Moreover, in the acoustic wave devices 1 and 101, when the first electrode 3 and the second electrode 4 are electrodes adjacent to each other and it is assumed that the thickness of the piezoelectric layer 2 is d and the center-to-center spacing distance between the first electrode 3 and the second electrode 4 is p, d/p is about 0.5 or smaller, for example. Therefore, a Q factor can be increased even when the size of the acoustic wave device is reduced.

In the acoustic wave devices 1 and 101, the piezoelectric layer 2 is formed by lithium niobate or lithium tantalate. The first electrode 3 and the second electrode 4 opposed to each other in the direction intersecting with the thickness direction of the piezoelectric layer 2 are provided to the first principal surface 2*a* or the second principal surface 2*b* of the piezoelectric layer 2, and a protection film desirably covers over the first electrode 3 and the second electrode 4.

In the acoustic wave devices 1 and 41, an energy confining layer is provided between the piezoelectric layer 2 and the support substrate 8. The energy confining layer is a layer which confines an acoustic wave such as a thickness-shear first mode bulk wave in the piezoelectric layer 2. As the energy confining layer, for example, the hollow portion 9, an acoustic reflection film 11, an acoustic reflection layer, or a multilayer body of a low acoustic velocity layer and a high acoustic velocity layer, which will be described later, may be used. The acoustic reflection layer is a layer including the low acoustic impedance layer and the high acoustic impedance layer laminated to the low acoustic impedance layer. Here, the acoustic multilayer film 42 is one example of the acoustic reflection layer and the multilayer body of the low acoustic velocity layer and the high acoustic velocity layer.

Figure 14:
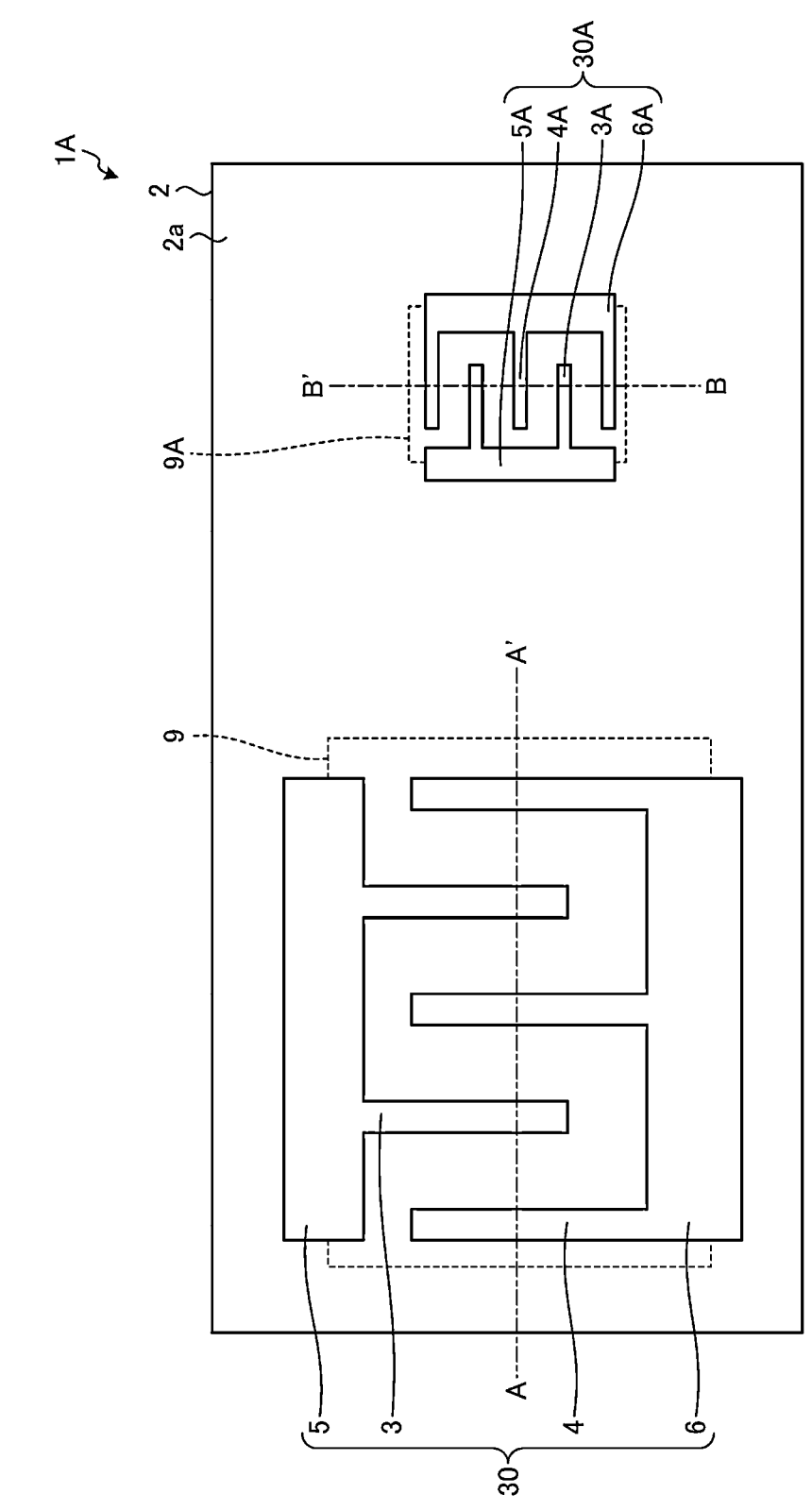
FIG. 14 is a plan view illustrating one example of the first preferred embodiment of the present invention.

FIG. 14 is a plan view illustrating one example of the first preferred embodiment. As illustrated in FIG. 14, an acoustic wave device 1A according to the example of the first preferred embodiment includes a first resonator 20 which utilizes the thickness-shear first mode and a second resonator 20A which does not utilize the thickness-shear first mode, the first resonator 20 and the second resonator 20A being provided to the support substrate 8.

Figure 15A:
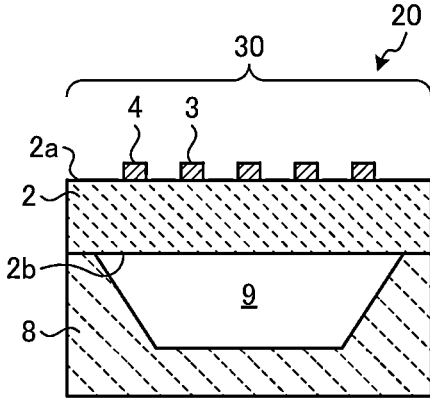
FIG. 15A is one example of a partial sectional view taken along a line A-A' in FIG. 14.

FIG. 15A is one example of a partial sectional view taken along a line A-A' in FIG. 14. The first resonator 20 is a resonator laminated to the piezoelectric layer 2 in the Z direction. The first resonator 20 is a resonator including a first IDT electrode 30 and a multilayer body of which at least a portion overlaps the first IDT electrode 30 in plan view in the Z direction. In the example in FIG. 15A, the multilayer body of the first resonator 20 includes the first IDT electrode 30, a portion of the piezoelectric layer 2, and the hollow portion 9.

The first IDT electrode 30 includes the first electrode 3, the second electrode 4, the first busbar electrode 5, and the second busbar electrode 6. The first IDT electrode 30 is configured such that at least one pair of the first electrode 3 and the second electrode 4 can resonate, and d/p is preferably about 0.5 or smaller, for example. The first resonator 20 is configured to utilize a thickness-shear first mode bulk wave.

Figure 15B:
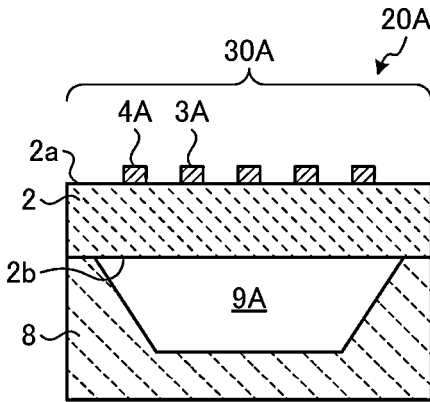
FIG. 15B is one example of a partial sectional view taken along a line B-B' in FIG. 14.

FIG. 15B is one example of a partial sectional view taken along a line B-B' in FIG. 14. The second resonator 20A is a resonator laminated to the piezoelectric layer 2 in the Z direction. The second resonator 20A is a resonator including a second IDT electrode 30A and a multilayer body of which at least a portion overlaps the second IDT electrode 30A in plan view in the Z direction. Moreover, in the example in FIG. 15B, the multilayer body of the second resonator 20A includes the second IDT electrode 30A, a portion of the piezoelectric layer 2 and a hollow portion 9A. The second IDT electrode 30A is configured such that at least one pair of a third electrode 3A and a fourth electrode 4A can resonate, and d/p is preferably larger than 0.5. The second resonator 20A is configured to utilize a wave other than a thickness-shear first mode bulk wave, and in the first preferred embodiment, is configured to utilize an S0 mode plate wave.

The second IDT electrode 30A includes the first electrode 3A, the second electrode 4A, a third busbar electrode 5A, and a fourth busbar electrode 6A. Here, an angle between a direction orthogonal or substantially orthogonal to a longitudinal direction of the first electrode 3A or the second electrode 4A and the direction orthogonal or substantially orthogonal to the longitudinal direction of the first electrode 3 or the second electrode 4 is preferably within a range of about 90°±10°, for example.

Figure 16:
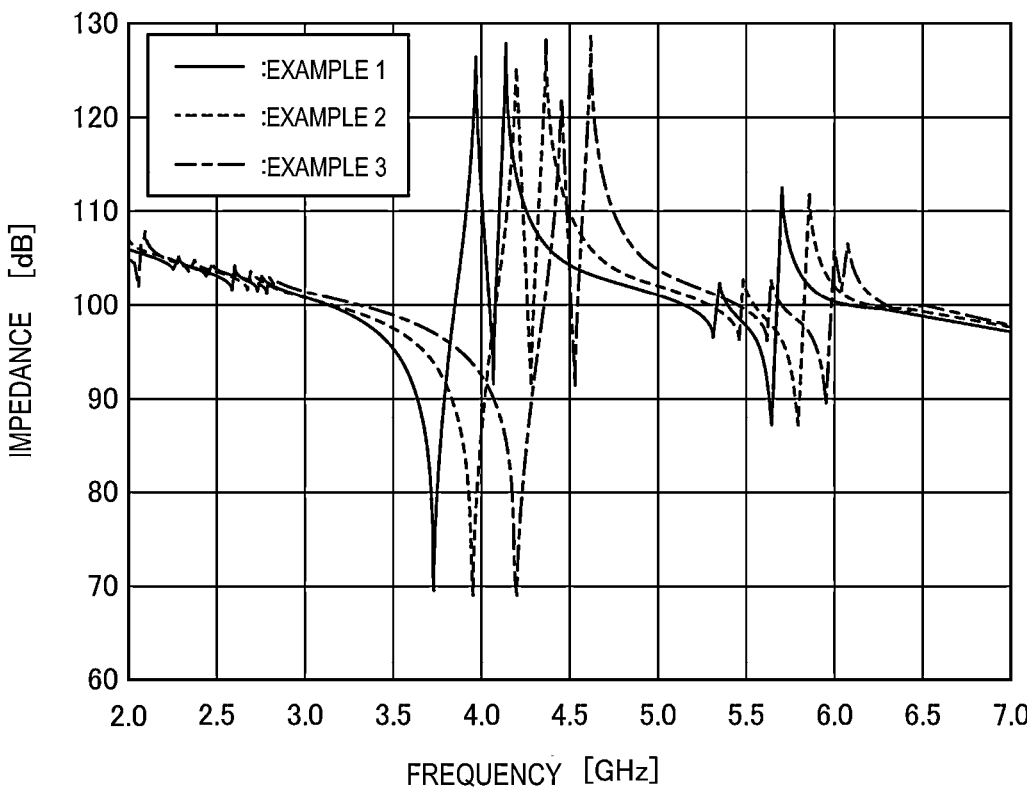
FIG. 16 is a reference diagram illustrating one example of resonance characteristics of an acoustic wave device of the example of the first preferred embodiment of the present invention.

FIG. 16 is an explanatory diagram illustrating frequency characteristics of the acoustic wave device according to the example of the first preferred embodiment. The piezoelectric layer 2 of the acoustic wave device according to FIG. 16 is LiNbO₃ having Euler angles (0°, 37.5°, 0°), and has a thickness of about 0.45 μm and a propagation angle of about 90°, for example. Moreover, the distance between electrodes of the second IDT electrode of the acoustic wave device according to FIG. 16 is about 1.7 μm in Example 1, about 1.6 μm in Example 2, and about 1.5 μm in Example 3.

Values fr, fa, and (fa–fr)/fr obtained based on the frequency characteristics of the acoustic wave device 1A according to FIG. 16 are shown in Table 1. Here, the fr is a resonant frequency of the first resonator 20 of the acoustic wave device 1A. The fa is an anti-resonant frequency of the first resonator 20. Moreover, the (fa–fr)/fr is a fractional bandwidth of the first resonator 20.

TABLE 1

| | Resonant frequency fr (GHz) | Anti-resonant frequency fa (GHz) | Fractional bandwidth (fa − fr)/fr (%) |
|---|---|---|---|
| Example 1 | 3730 | 3970 | 6.4 |
| Example 2 | 3950 | 4200 | 6.3 |
| Example 3 | 4200 | 4460 | 6.2 |

As is apparent from FIG. 16 and Table 1, by the spacing between the electrodes of the second resonator 20A being adjusted, in terms of the first resonator 20, the resonant frequency can be adjusted while influence on the fractional bandwidth is suppressed.

Although the example of the acoustic wave device according to the first preferred embodiment is described above, the configuration of the acoustic wave device 1A is not limited to the configuration illustrated in FIGS. 15A and 15B. Other modifications are described below with reference to the drawings.

Figure 17A:
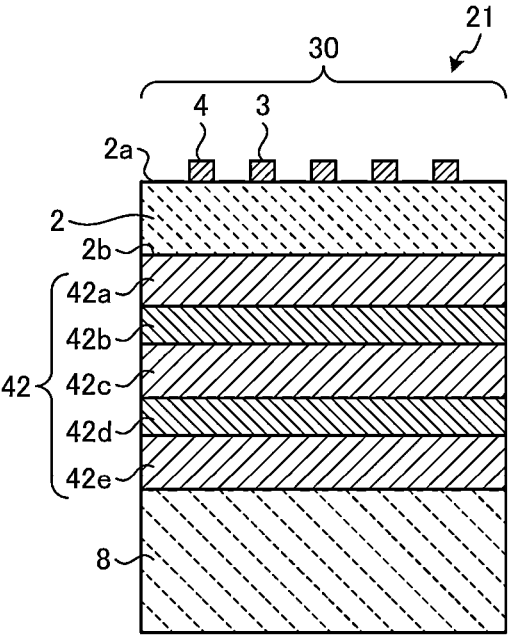
FIG. 17A is a first modification of the partial sectional view taken along the line A-A' in FIG. 14.
Figure 17B:
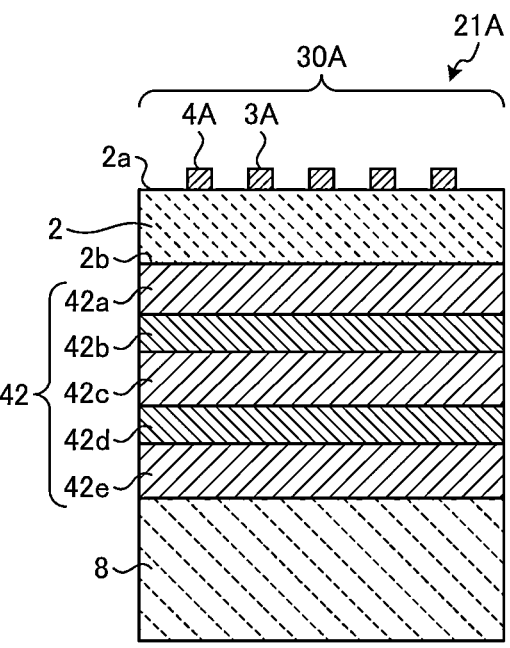
FIG. 17B is the first modification of the partial sectional view taken along the line B-B' in FIG. 14.

FIG. 17A is a first modification of the partial sectional view taken along the line A-A' in FIG. 14. FIG. 17B is the first modification of the partial sectional view taken along the line B-B' in FIG. 14. As illustrated in FIGS. 17A and 17B, the support substrate 8 and the piezoelectric layer 2 may be laminated to each other with the acoustic multilayer film 42 interposed therebetween. That is, a first resonator 21 and a second resonator 21A may include the acoustic multilayer film 42 as the energy confining layer. Also in this case, the resonant frequency of the first resonator 21 can be adjusted. Note that although, in the first modification, the low acoustic impedance layers 42a, 42c, and 42e constituting the acoustic multilayer film 42 are made of, for example, silicon oxide and the high acoustic impedance layers 42b and 42d constituting the acoustic multilayer film 42 are made of platinum, any suitable material may be used as long as the acoustic impedance relation described above is satisfied.

Figure 18A:
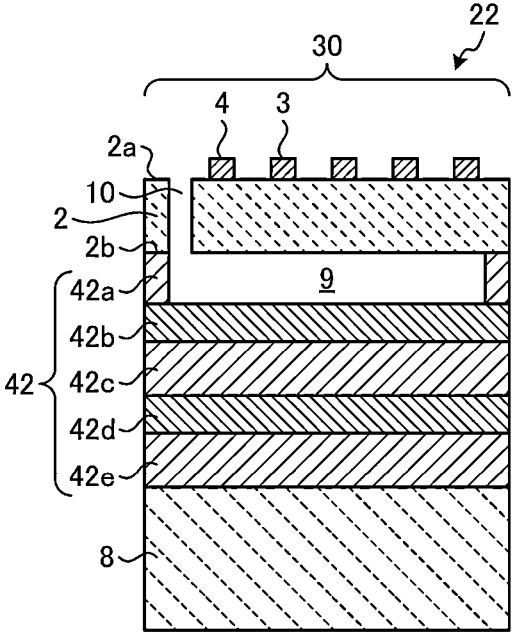
FIG. 18A is a second modification of the partial sectional view taken along the line A-A' in FIG. 14.
Figure 18B:
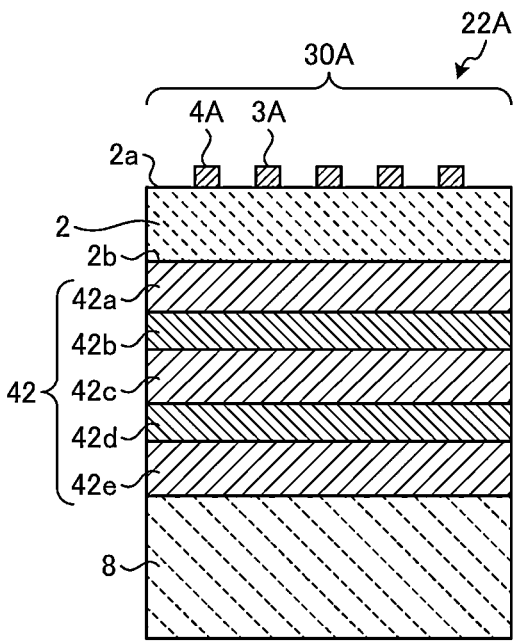
FIG. 18B is the second modification of the partial sectional view taken along the line B-B' in FIG. 14.

FIG. 18A is a second modification of the partial sectional view taken along the line A-A' in FIG. 14. FIG. 18B is the second modification of the partial sectional view taken along the line B-B' in FIG. 14. Like the first modification, when the support substrate 8 and the piezoelectric layer 2 are laminated to each other with the acoustic multilayer film 42 interposed therebetween, a first resonator 22 is preferably provided with the hollow portion 9 and a through hole 10 as illustrated in FIG. 18A. In the second modification, the hollow portion 9 is a hollow provided to the acoustic multilayer film 42, and is provided to, for example, the low acoustic impedance layer 42a which contacts the second principal surface 2b of the piezoelectric layer 2. Note that a second resonator 22A is preferably not provided with a hollow portion. Therefore, a thickness-shear first mode bulk wave can suitably be propagated in the first resonator 22, and an S0 mode plate wave can suitably be propagated in the second resonator 22A.

The through hole 10 is a hole extending through the piezoelectric layer 2 in the Z direction. The through hole 10 communicates with the hollow portion 9 in the Z direction in the first resonator 22. A sacrificial layer is provided to the acoustic multilayer film 42, and the piezoelectric layer 2 is laminated to the sacrificial layer. Then, the through hole 10 is provided to the piezoelectric layer 2, and etchant is poured into the through hole 10, thus the sacrificial layer being removed. Therefore, the hollow portion 9 can easily be formed, and manufacturing the acoustic wave device 1A becomes easier.

Figure 19A:
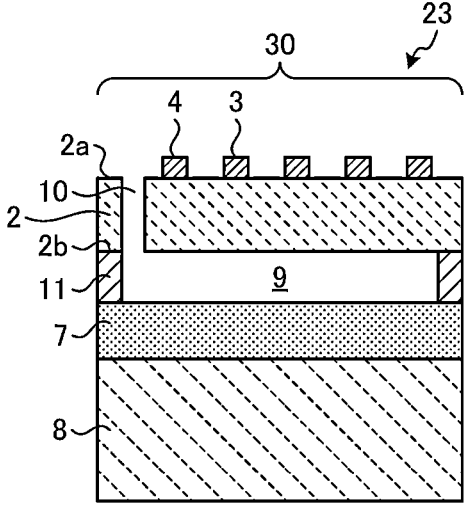
FIG. 19A is a third modification of the partial sectional view taken along the line A-A' in FIG. 14.
Figure 19B:
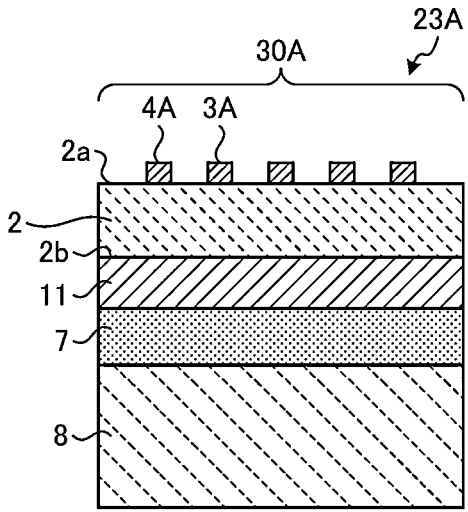
FIG. 19B is the third modification of the partial sectional view taken along the line B-B' in FIG. 14.

FIG. 19A is a third modification of the partial sectional view taken along the line A-A' in FIG. 14. FIG. 19B is the third modification of the partial sectional view taken along the line B-B' in FIG. 14. As illustrated in FIGS. 19A and 19B, the acoustic wave device 1A may further be provided with the dielectric film 7. In this case, the energy confining layer is provided between the piezoelectric layer 2 and the dielectric film 7. In the third modification, the dielectric film 7 is made of silicon nitride, for example. In a first resonator 23 of the third example, the energy confining layer is the acoustic reflection film 11 provided with the hollow portion

9 on the piezoelectric layer 2 side. The acoustic reflection film 11 is a layer made of silicon oxide, for example. Here, in the first resonator 23, the through hole 10 is preferably provided similarly to the second modification. In a second resonator 23A of the third example, the energy confining layer is the acoustic reflection film 11. Here, in the second resonator 23A, the acoustic reflection film 11 is preferably not provided with a hollow portion. Therefore, a thickness-shear first mode bulk wave can suitably be propagated in the first resonator 23, and an S0 mode plate wave can suitably be propagated in the second resonator 23A.

As described above, the acoustic wave device 1A according to the first preferred embodiment includes the support substrate 8, the piezoelectric layer 2, the energy confining layer, the first resonator 20, and the second resonator 20A. The piezoelectric layer 2 includes the principal surface in the first direction which is the thickness direction of the support substrate 8 and includes lithium niobate or lithium tantalate. The energy confining layer is provided between the support substrate 8 and the piezoelectric layer 2 in the first direction. The first resonator 20 and the second resonator 20A are provided to the support substrate 8, and each includes at least one pair of the first electrode 3 and the second electrode 4 configured to resonate. The first resonator 20 is configured to utilize a thickness-shear mode bulk wave, and the second resonator 20A is configured to utilize a wave other than a thickness-shear mode bulk wave. In this configuration, in terms of the first resonator 20, frequency characteristics can be adjusted by adjusting a parameter (for example, the pitch of the second IDT electrode 30A) other than the thickness of the piezoelectric layer 2. Therefore, adjustment of the fractional bandwidth can be easier.

Moreover, the acoustic wave device 1A according to the first preferred embodiment includes the support substrate 8, the piezoelectric layer 2, the energy confining layer, the first resonator 20, and the second resonator 20A. The piezoelectric layer 2 has the principal surface in the first direction which is the thickness direction of the support substrate 8 and includes lithium niobate or lithium tantalate. The energy confining layer is provided between the support substrate 8 and the piezoelectric layer 2 in the first direction. Each of the first resonator 20 and the second resonator 20A includes at least one pair of the first electrode 3 and the second electrode 4 provided to the principal surface of the piezoelectric layer 2. Assuming that the film thickness of the piezoelectric layer 2 is d and the center-to-center spacing distance between the first electrode 3 and the second electrode 4 adjacent to each other is p, d/p of the first resonator 20 is about 0.5 or smaller, and d/p of the second resonator 20A is larger than about 0.5, for example. In this configuration, in terms of the first resonator 20, frequency characteristics can be adjusted by adjusting a parameter (for example, the pitch of the IDT electrode of the second resonator 20A) other than the thickness of the piezoelectric layer 2. Therefore, adjustment of the fractional bandwidth can be easier.

As a desirable aspect, the second resonator 20A is configured to utilize a plate wave. In this configuration, in terms of the first resonator 20, frequency characteristics can be adjusted by the pitch of the IDT electrode of the second resonator 20A. Therefore, adjustment of the fractional bandwidth can be easier.

Moreover, the energy confining layer may be the hollow (hollow portion 9). Also in this case, adjustment of the fractional bandwidth can be easier.

Moreover, the energy confining layer may be the acoustic reflection layer (for example, the acoustic multilayer film 42) including the low acoustic impedance layer and the high acoustic impedance layer laminated to the low acoustic impedance layer. Also in this case, adjustment of the fractional bandwidth can be easier.

As a desirable aspect, in the first resonator 21, 22, the layer in the acoustic reflection layer closest to the piezoelectric layer 2 in the first direction is the low acoustic impedance layer 42a. The low acoustic impedance layer 42a is provided with the hollow (hollow portion 9). Therefore, adjustment of the fractional bandwidth can be easier.

As a desirable aspect, in the second resonator 21A, 22A, the acoustic reflection layer is not provided with a hollow portion. Therefore, adjustment of the fractional bandwidth can be easier.

Moreover, the energy confining layer is the multilayer body (for example, the acoustic multilayer film 42) of the low acoustic velocity layer and the high acoustic velocity layer. Also in this case, adjustment of the fractional bandwidth can be easier.

As a desirable aspect, the hole (through hole 10) passing through the piezoelectric layer 2 in the first direction is provided. Therefore, by the sacrificial layer provided to the layer closest to the piezoelectric layer 2 being etched, the hollow portion 9 can easily be formed. Thus, manufacturing the acoustic wave device 1A becomes easier.

As a desirable aspect, the piezoelectric layer 2 includes rotated Y-cut lithium niobate. The angle between the direction orthogonal or substantially orthogonal to the longitudinal direction of the first electrode 3 or the second electrode 4 of the first resonator 20 and the direction orthogonal or substantially orthogonal to the longitudinal direction of the first electrode 3A or the second electrode 4A of the second resonator 20A is about 90°±10°, for example. Therefore, adjustment of the fractional bandwidth can be easier.

As a desirable aspect, Euler angles ($\varphi$, $\theta$, $\psi$) of the lithium niobate or the lithium tantalate of the piezoelectric layer 2 are within the range expressed by the following Formula (1), Formula (2), or Formula (3). In this case, the fractional bandwidth can sufficiently be widened.

$$(0°±10°, 0° \text{ to } 20°, \text{any } \psi) \tag{1}$$

$$(0°±10°, 20° \text{ to } 80°, 0° \text{ to } 60° (1-(\theta-50)^2/900)^{1/2}) \text{ or}$$
$$(0°±10°, 20° \text{ to } 80°, [180°-60° (1-(\theta-50)^2/900)^{1/2}] \text{ to } 180°) \tag{2}$$

$$(0°±10°, [180°-30° (1-(\psi-90)^2/8100)^{1/2}] \text{ to } 180°, \text{any } \psi) \tag{3}$$

As a further desirable aspect, d/p is about 0.24 or smaller, for example. Therefore, the size of the acoustic wave device 1 can be reduced, and the Q factor can be increased.

As a desirable aspect, assuming that the overlapping range of the first electrode 3 and the second electrode 4 adjacent to each other when seen in the opposing direction of the first electrode 3 and the second electrode 4 is the excitation range C and the metallization ratio of the plurality of first electrodes 3 and second electrodes 4 with respect to the excitation range C is MR, MR≤1.75(d/p)+0.075 is satisfied. In this case, the fractional bandwidth can certainly be brought to about 17% or lower, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support substrate;

a piezoelectric layer including a principal surface extending in a first direction and including lithium niobate or lithium tantalate, the first direction being a thickness direction of the support substrate;

an energy confining layer between the support substrate and the piezoelectric layer in the first direction; and a first resonator and a second resonator provided to the support substrate and each including at least one pair of a first electrode and a second electrode; wherein the first resonator is structured to generate a thickness-shear mode bulk wave;

the second resonator is structured to generate a wave other than a thickness-shear mode bulk wave;

the piezoelectric layer includes rotated Y-cut lithium niobate; and an angle between a direction orthogonal or substantially orthogonal to a longitudinal direction of the first electrode or the second electrode of the first resonator and a direction orthogonal or substantially orthogonal to a longitudinal direction of the first electrode or the second electrode of the second resonator is about 90°±10°.

2. The acoustic wave device according to claim 1, wherein the second resonator is structured to generate a plate wave.

3. The acoustic wave device according to claim 1, wherein the energy confining layer includes a hollow portion.

4. The acoustic wave device according to claim 1, wherein the energy confining layer includes an acoustic reflection layer including a low acoustic impedance layer and a high acoustic impedance layer laminated to the low acoustic impedance layer.

5. The acoustic wave device according to claim 4, wherein in the first resonator, a layer in the acoustic reflection layer closest to the piezoelectric layer in the first direction is the low acoustic impedance layer; and the low acoustic impedance layer includes a hollow portion.

6. The acoustic wave device according to claim 4, wherein in the second resonator, the acoustic reflection layer does not include a hollow portion.

7. The acoustic wave device according to claim 1, wherein the energy confining layer is a multilayer body including a low acoustic velocity layer and a high acoustic velocity layer.

8. The acoustic wave device according to claim 3, wherein a hole extends through the piezoelectric layer in the first direction.

9. The acoustic wave device according to claim 1, wherein assuming that a film thickness of the piezoelectric layer is d and a center-to-center spacing distance between the first electrode and the second electrode adjacent to each other is p, d/p is about 0.24 or smaller.

10. The acoustic wave device according to claim 1, wherein assuming that an overlapping range of the first electrode and the second electrode adjacent to each other when seen in an opposing direction of the first electrode and the second electrode is an excitation range and a metallization ratio of a plurality of first electrodes and second electrodes with respect to the excitation range is MR, MR≤about 1.75(d/p)+0.075 is satisfied, each of the plurality of first electrodes and second electrodes being the first electrode and the second electrode.

11. An acoustic wave device comprising:

a support substrate;

a piezoelectric layer including a principal surface extending in a first direction and including lithium niobate or lithium tantalate, the first direction being a thickness direction of the support substrate;

an energy confining layer between the support substrate and the piezoelectric layer in the first direction; and a first resonator and a second resonator provided to the support substrate and each including at least one pair of a first electrode and a second electrode; wherein the first resonator is structured to generate a thickness-shear mode bulk wave;

the second resonator is structured to generate a wave other than a thickness-shear mode bulk wave; and Euler angles ($\phi$, $\theta$, $\psi$) of the lithium niobate or the lithium tantalate of the piezoelectric layer are within a range expressed by Formula (1), Formula (2), or Formula (3):

$$(0°\pm10°, 0° \text{ to } 20°, \text{ any } \psi) \tag{1}$$

$$\begin{aligned}(0°\pm10°, 20° \text{ to } 80°, 0° \text{ to } 60° \ (1-(\theta-50)^2/900)^{1/2}) \text{ or}\\ (0°\pm10°, 20° \text{ to } 80°, [180°-60° \ (1-(\theta-50)^2/\\ 900)^{1/2}] \text{ to } 180°)\end{aligned} \tag{2}$$

$$\begin{aligned}(0°\pm10°, [180°-30° \ (1-(\psi-90)^2/8100)^{1/2}] \text{ to } 180°,\\ \text{any } \psi)\end{aligned} \tag{3}.$$

12. An acoustic wave device comprising:

a support substrate;

a piezoelectric layer including a principal surface extending in a first direction and including lithium niobate or lithium tantalate, the first direction being a thickness direction of the support substrate;

an energy confining layer between the support substrate and the piezoelectric layer in the first direction; and a first resonator and a second resonator each including at least one pair of a first electrode and a second electrode provided to the principal surface of the piezoelectric layer; wherein assuming that a film thickness of the piezoelectric layer is d and a center-to-center spacing distance between the first electrode and the second electrode adjacent to each other is p, d/p of the first resonator is about 0.5 or smaller;

d/p of the second resonator is larger than about 0.5;

the piezoelectric layer includes rotated Y-cut lithium niobate; and an angle between a direction orthogonal or substantially orthogonal to a longitudinal direction of the first electrode or the second electrode of the first resonator and a direction orthogonal or substantially orthogonal to a longitudinal direction of the first electrode or the second electrode of the second resonator is about 90°±10°.

13. The acoustic wave device according to claim 12, wherein assuming that an overlapping range of the first electrode and the second electrode adjacent to each other when seen in an opposing direction of the first electrode and the second electrode is an excitation range and a metallization ratio of a plurality of first electrodes and second electrodes with respect to the excitation range is MR, MR≤about 1.75(d/p)+0.075 is satisfied, each of the plurality of first electrodes and second electrodes being the first electrode and the second electrode.

14. The acoustic wave device according to claim 12, wherein the second resonator is structured to generate a plate wave.

15. The acoustic wave device according to claim 12, wherein the energy confining layer includes a hollow portion.

16. The acoustic wave device according to claim 12, wherein the energy confining layer includes an acoustic reflection layer including a low acoustic impedance layer and a high acoustic impedance layer laminated to the low acoustic impedance layer.

17. The acoustic wave device according to claim 16, wherein in the first resonator, a layer in the acoustic reflection layer closest to the piezoelectric layer in the first direction is the low acoustic impedance layer; and the low acoustic impedance layer includes a hollow portion.

18. The acoustic wave device according to claim 16, wherein in the second resonator, the acoustic reflection layer does not include a hollow portion.

19. The acoustic wave device according to claim 12, wherein the energy confining layer is a multilayer body including a low acoustic velocity layer and a high acoustic velocity layer.

20. The acoustic wave device according to claim 15, wherein a hole extends through the piezoelectric layer in the first direction.

21. The acoustic wave device according to claim 12, wherein assuming that a film thickness of the piezoelectric layer is d and a center-to-center spacing distance between the first electrode and the second electrode adjacent to each other is p, d/p is about 0.24 or smaller.

22. The acoustic wave device according to claim 12, wherein

Euler angles ($\phi$, $\theta$, $\psi$) of the lithium niobate or the lithium tantalate of the piezoelectric layer are within a range expressed by Formula (1), Formula (2), or Formula (3):

$$(0°\pm10°, 0° \text{ to } 20°, \text{ any } \psi) \tag{1}$$

$$\begin{aligned}(0°\pm10°, 20° \text{ to } 80°, 0° \text{ to } 60° \ (1-(\theta-50)^2/900)^{1/2}) \text{ or}\\ (0°\pm10°, 20° \text{ to } 80°, [180°-60° \ (1-(\theta-50)^2/\\ 900)^{1/2}] \text{ to } 180°)\end{aligned} \tag{2}$$

$$\begin{aligned}(0°\pm10°, [180°-30° \ (1-(\psi-90)^2/8100)^{1/2}] \text{ to } 180°,\\ \text{any } \psi)\end{aligned} \tag{3}.$$

* * * * *